United States Patent
Oh et al.

(10) Patent No.: US 9,608,139 B2
(45) Date of Patent: Mar. 28, 2017

(54) SOLAR CELL

(71) Applicant: LG ELECTRONICS INC., Seoul (KR)

(72) Inventors: Donghae Oh, Seoul (KR); Sungho Chang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 255 days.

(21) Appl. No.: 13/779,054

(22) Filed: Feb. 27, 2013

(65) Prior Publication Data

US 2014/0060638 A1 Mar. 6, 2014

(30) Foreign Application Priority Data

Aug. 29, 2012 (KR) ........................ 10-2012-0095146

(51) Int. Cl.
*H01L 31/0224* (2006.01)
*H01L 31/05* (2014.01)

(52) U.S. Cl.
CPC .. *H01L 31/022433* (2013.01); *H01L 31/0504* (2013.01); *Y02E 10/50* (2013.01)

(58) Field of Classification Search
None
See application file for complete search history.

(56) References Cited

U.S. PATENT DOCUMENTS

| | | | | |
|---|---|---|---|---|
| 4,104,084 A * | 8/1978 | Evans, Jr. | ...................... | 136/256 |
| 4,590,327 A * | 5/1986 | Nath et al. | ...................... | 136/256 |
| 5,259,891 A * | 11/1993 | Matsuyama et al. | ......... | 136/244 |
| 5,330,585 A * | 7/1994 | Chang et al. | .................. | 136/256 |
| 5,759,291 A * | 6/1998 | Ichinose et al. | ............... | 136/256 |
| 5,942,048 A * | 8/1999 | Fujisaki et al. | ............... | 136/256 |
| 6,806,414 B2 * | 10/2004 | Shiotsuka et al. | ............ | 136/256 |
| 2004/0261838 A1 * | 12/2004 | Cotal et al. | .................... | 136/256 |
| 2009/0188555 A1 * | 7/2009 | Castillo et al. | ............... | 136/256 |
| 2009/0266402 A1 * | 10/2009 | Taira | .............................. | 136/244 |
| 2012/0037200 A1 * | 2/2012 | Hong | .................... | H01L 31/048 136/244 |
| 2012/0080069 A1 | 4/2012 | Ishiguro et al. | | |
| 2012/0085401 A1 * | 4/2012 | Borland et al. | ............... | 136/256 |

(Continued)

FOREIGN PATENT DOCUMENTS

| | | | | |
|---|---|---|---|---|
| CA | 2820034 A1 * | 6/2014 | ............ | H01L 31/04 |
| EP | 1 811 576 A2 | 7/2007 | | |

(Continued)

OTHER PUBLICATIONS

Machine translation of JP H09-116179A.*

(Continued)

*Primary Examiner* — Eric R Smith
(74) *Attorney, Agent, or Firm* — Birch, Stewart, Kolasch & Birch, LLP

(57) ABSTRACT

A solar cell according to an embodiment of the invention includes: a substrate; a dopant layer formed at the substrate; an electrode electrically connected to the dopant layer, wherein the electrode includes a plurality of finger electrodes that are parallel to each other; and a ribbon-connected portion formed on the dopant layer, wherein the ribbon-connected portion includes a non-conductive material. A portion of the plurality of finger electrodes is formed on the ribbon-connected portion.

21 Claims, 19 Drawing Sheets

(56) References Cited

U.S. PATENT DOCUMENTS

2013/0104961 A1    5/2013  Tohoda

FOREIGN PATENT DOCUMENTS

| | | |
|---|---|---|
| EP | 2 113 948 A2 | 11/2009 |
| JP | 9-115179 A | 5/1997 |
| JP | 2008-288333 A | 11/2008 |
| JP | 2008-294366 A | 12/2008 |
| WO | WO 2011/148839 A1 | 12/2011 |

OTHER PUBLICATIONS

Definition of substrate [retrieved from internet at http://www.oxforddictionaries.com/us/definition/american_english/substrate on Jul. 23, 2015].*

* cited by examiner

SOLAR CELL

CROSS-REFERENCE TO RELATED APPLICATION

This application claims priority to and the benefit of Korean Patent Application No. 10-2012-0095146, filed on Aug. 29, 2012 in the Korean Intellectual Property Office, the disclosure of which is incorporated herein by reference.

BACKGROUND OF THE INVENTION

1. Field of the Invention

Embodiments of the invention relate to a solar cell, and more particularly, to a solar cell having an enhanced structure.

2. Description of the Related Art

Recently, as existing energy resources such as oil or coal are expected to be exhausted, an interest in alternative energy resources for replacing the oil or coal is increasing. In particular, a solar cell that directly converts or transforms solar energy into electricity is gaining attention.

A plurality of layers and electrodes are formed to manufacture a solar cell. The solar cell is connected to adjacent solar cell by a ribbon. In this instance, the ribbon is electrically connected to a bus bar electrode. With consideration of electrical property, the bus bar electrode has a relatively large width to correspond to a width of the ribbon. The bus bar electrode is made of a metal for electrically connecting to the ribbon, and an expensive metal is generally used for the metal. Accordingly, cost for forming the bus bar electrode is high, and thus, productivity of the solar cell may be low.

SUMMARY OF THE INVENTION

The embodiments of the invention are directed to provide a solar cell having enhanced productivity and efficiency.

A solar cell according to an embodiment of the invention includes: a substrate; a dopant layer formed at the substrate; an electrode electrically connected to the dopant layer, wherein the electrode includes a plurality of finger electrodes that are parallel to each other; and a ribbon-connected portion formed on the dopant layer, wherein the ribbon-connected portion includes a non-conductive material. A portion of the plurality of finger electrodes is formed on the ribbon-connected portion.

A solar cell according to an embodiment of the invention includes: a substrate; a dopant layer formed at the substrate; an electrode electrically connected to the dopant layer, wherein the electrode includes a plurality of finger electrodes that are parallel to each other; and a ribbon electrically connected to the electrode, wherein the ribbon is configured to be connected to the outside. The plurality of finger electrodes and the ribbon are overlapped with each other.

DETAILED DESCRIPTION OF THE EMBODIMENTS

Figure 1:
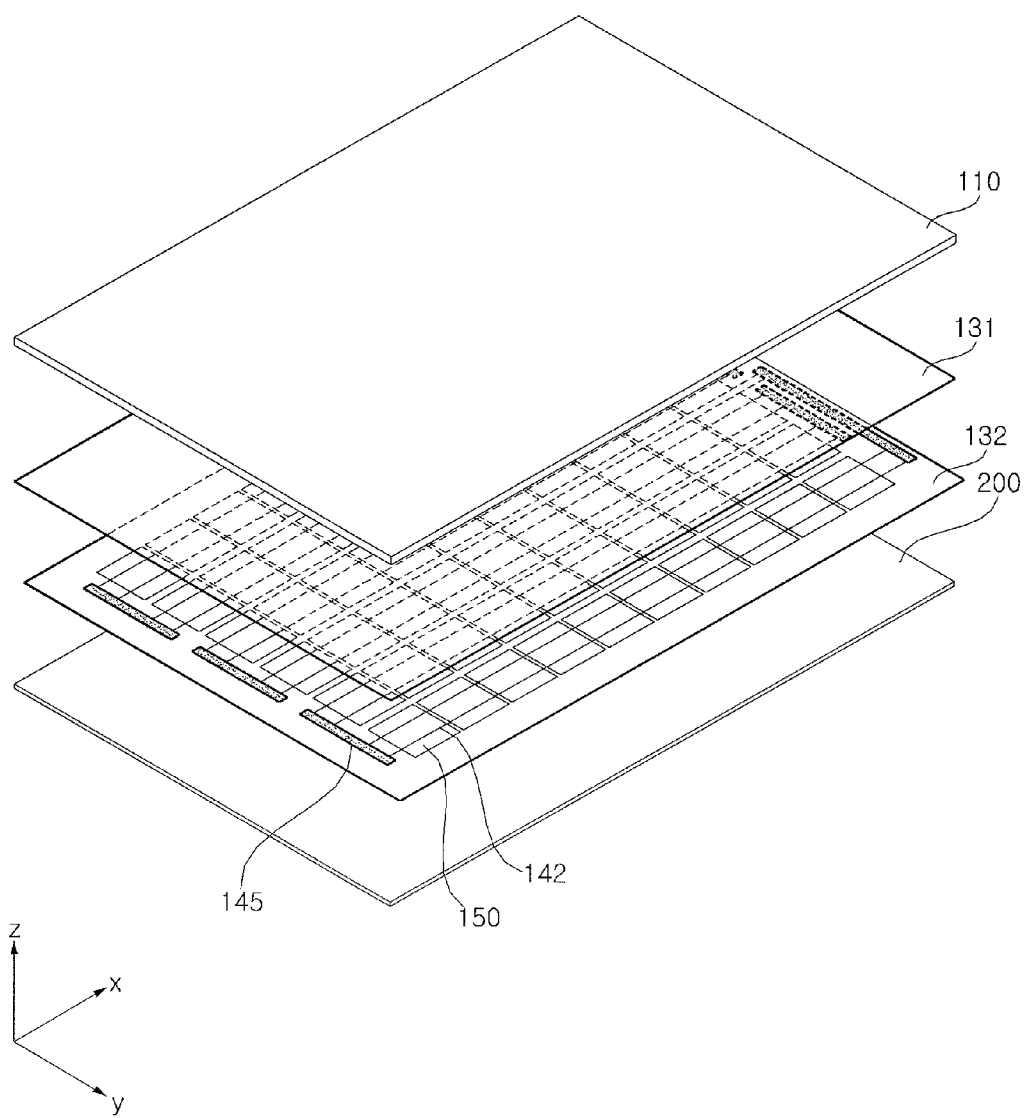
FIG. 1 is an exploded perspective view of a solar cell module according to an embodiment of the invention.

Hereinafter, embodiments of the invention will be described with reference to the accompanying drawings. However, the embodiments of the invention are not limited thereto, and the various modifications of the embodiments are possible.

In order to clearly and concisely illustrate the embodiments of the invention, elements not related to the invention are omitted in the figures. Also, elements similar to or the same as each other have the same reference numerals. In addition, the dimensions of layers and regions are exaggerated or schematically illustrated, or some layers are omitted for clarity of illustration. In addition, the dimension of each part as drawn may not reflect an actual size.

In the following description, when a layer or substrate "includes" another layer or portion, the layer or substrate may further include still another layer or portion. Also, when a layer or film is referred to as being "on" another layer or substrate, the layer of film may be directly on the other layer or substrate, or intervening layers may also be present. Further, when a layer or film is referred to as being "directly on" another layer or substrate, the layer or film is directly on the another layer or substrate, and thus, there is no intervening layer.

Figure 2:
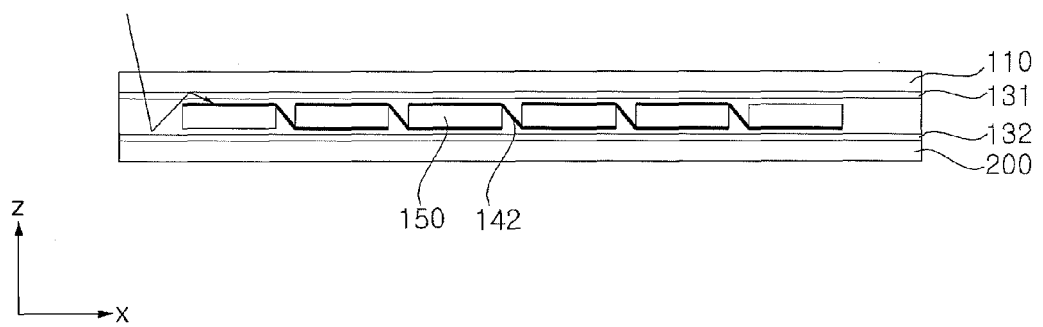
FIG. 2 is a schematic cross-sectional view of the solar cell module shown in FIG. 1.

FIG. 1 is an exploded perspective view of a solar cell module according to an embodiment of the invention, and FIG. 2 is a schematic cross-sectional view of the solar cell module shown in FIG. 1.

Referring to FIG. 1, a solar cell module 100 according to an embodiment of the invention includes a solar cell or solar cells 150, a front substrate 110 positioned on a front surface of the solar cell 150, and a back sheet 200 positioned on a back surface of the solar cell 150. Also, the solar cell module 100 may include a first sealing agent 131 disposed between the solar cell 150 and the front substrate 110, and a second sealing agent 132 disposed between the solar cell 150 and the back sheet 200.

First, each of the solar cells 150 is a device for converting solar energy into electric energy. For example, each of the solar cells 150 may be a silicon solar cell. However, embodiments of the invention are not limited thereto and the solar cells 150 may be compound semiconductor solar cells, tandem solar cells, or dye-sensitized solar cells in other embodiments of the invention.

The solar cells 150 may include a ribbon or ribbons 142, and are electrically connected to each other in series, parallel, or series-and-parallel arrangement by the ribbons 142. Specifically, the ribbons 142 connect a front electrode formed on a light-receiving surface of one solar cell 150 and a back electrode formed on a back surface of another solar cell 150 adjacent to the one solar cell 150 through a tabbing process. In the tabbing process, flux is applied to one surface of the solar cell 150, the ribbon 142 is positioned on each of the flux-applied solar cell 150, and then a firing process is performed. The flux is for removing an oxide layer that prevents a soldering from occurring. It is not necessary to include the flux in other embodiments of the invention.

Selectively, a conductive film may be attached between one surface of the solar cell 150 and the ribbons 142 and thermally compressed to connect the plurality of solar cells 150 in series or in parallel. The conductive film may include a base film and conductive particles dispersed in the base film. The conductive particles may be made of gold, silver, nickel, copper, or the like, having excellent conductivity. The base film may be made of an epoxy resin, an acryl resin, a polyimide resin, a polycarbonate resin, or the like. The conductive particles are exposed from the base film according to the thermo-compression, and the solar cell 150 and the ribbons 142 may be electrically connected by the exposed conductive particles. When the plurality of solar cells 150 are connected by the conductive film so as to be modularized, a processing temperature can be lowered to reduce or prevent the solar cell 150 from being bent.

In addition, each of bus ribbons 145 alternately connects both ends of the ribbons 142 of a line of the solar cells 150 connected by the ribbons 142. The bus ribbons 145 may be arranged at ends of the line of the solar cells 150 in a direction crossing a longitudinal direction of the line of the solar cells 150. In addition, the bus ribbons 145 collect electricity produced by the solar cells 150 and are connected to a junction box for preventing electricity from flowing backward or in a reverse direction.

The first sealing agent 131 may be positioned on the light-receiving surfaces of the solar cells 150, and the second sealing agent 132 may be positioned on the non-light-receiving surfaces of the solar cells 150. The first sealing agent 131 and the second sealing agent 132 are adhered to each other and/or to the solar cells 150 by lamination. The first sealing agent 131 and the second sealing agent 132 block moisture and/or oxygen that would adversely affect the solar cells 150, and chemically combine respective members of the solar cells 150.

The first sealing agent 131 and the second sealing agent 132 may include ethylene-vinyl acetate copolymer resin (EVA), polyvinyl butyral, silicon resin, ester-based resin, or olefin-based resin. However, the embodiments of the invention are not limited thereto. Therefore, the first and second sealing agents 131 and 132 may include one or more of various materials and may be formed by one or more of various methods other than lamination.

The front substrate 110 is positioned on the first sealing agent 131 to allow solar light to pass, and may be a tempered glass for the purpose of protection of the solar cells 150 from external shock. The front substrate 110, in order to reduce or prevent solar light from being reflected and to increase transmission of solar light, may be a low iron tempered glass containing a low iron content.

The back sheet 200 is a layer for protecting the other sides (the non-light-receiving surfaces) of the solar cells 150, and for performing water-proofing, insulation, and blocking of ultraviolet rays. The back sheet 200 may have a TPT (Tedlar/PET/Tedlar) type structure; however, the embodiments of the invention are not limited thereto. Also, the back sheet 200 may include a material having high reflectance in order to reflect solar light entering the front substrate 110 to be used again. However, the embodiments of the invention are not limited thereto. Thus, the back sheet 200 may include a transparent material to allow solar light to pass in order to achieve a bi-facial solar cell module. In embodiments of the invention, the solar cell 100 may be a bi-facial solar cell module.

Figure 3:
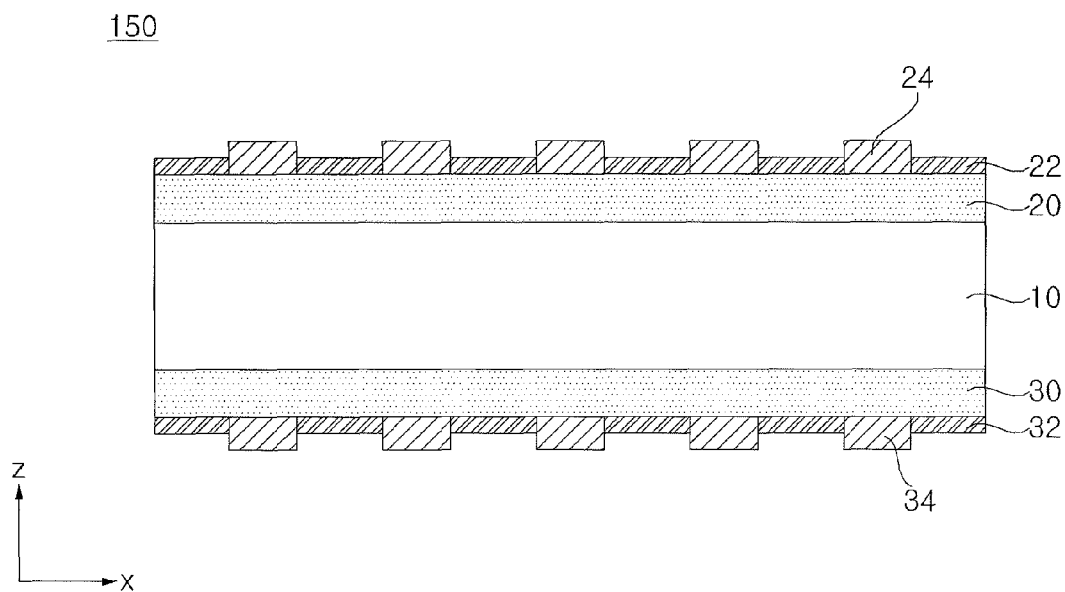
FIG. 3 is a partial cross-sectional view of the solar cell according to an embodiment of the invention.

Hereinafter, the solar cell 150 according to an embodiment of the invention will be described in more detail. FIG. 3 is a partial cross-sectional view of the solar cell 150 according to an embodiment of the invention. For reference, FIG. 3 is a cross-sectional view taken along a line of III-III FIG. 4.

Figure 5:
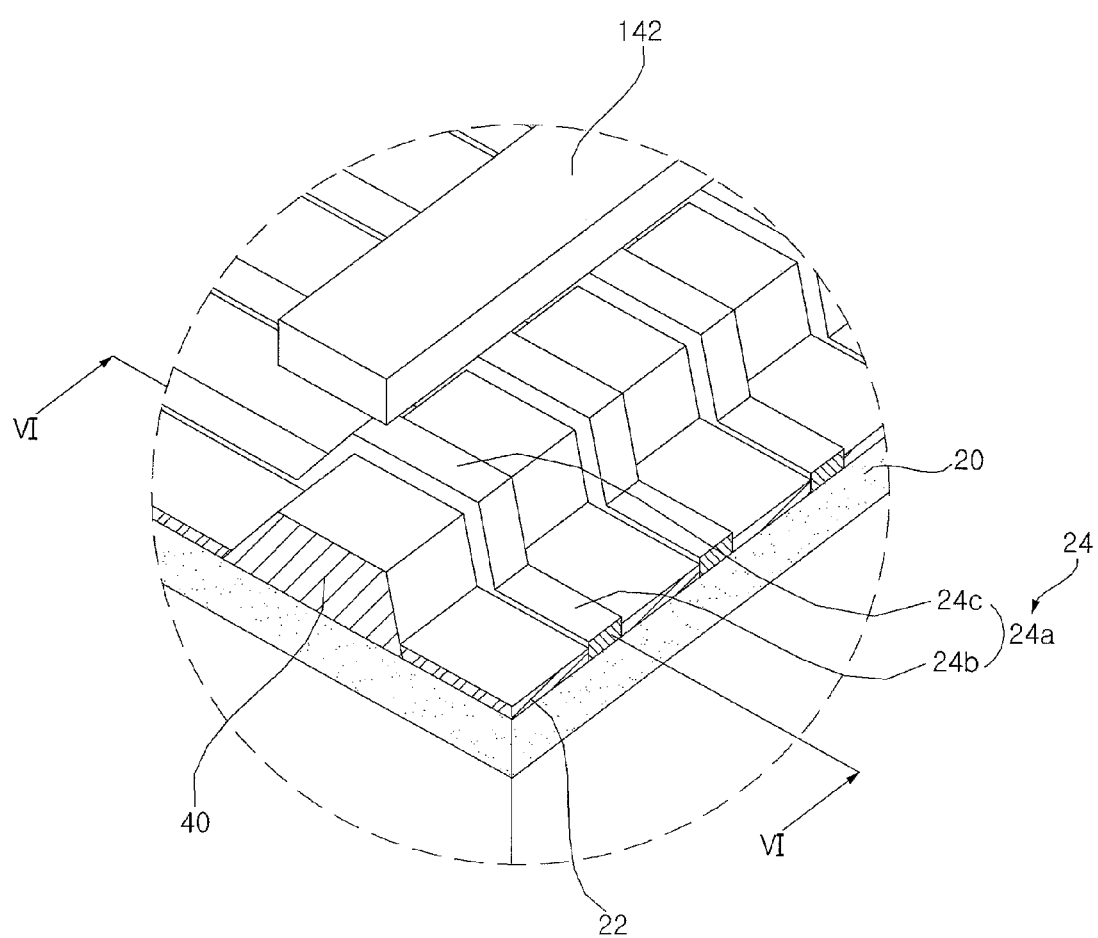
FIG. 5 is a partial exploded perspective view of a portion of A of FIG. 4.
Figure 6:
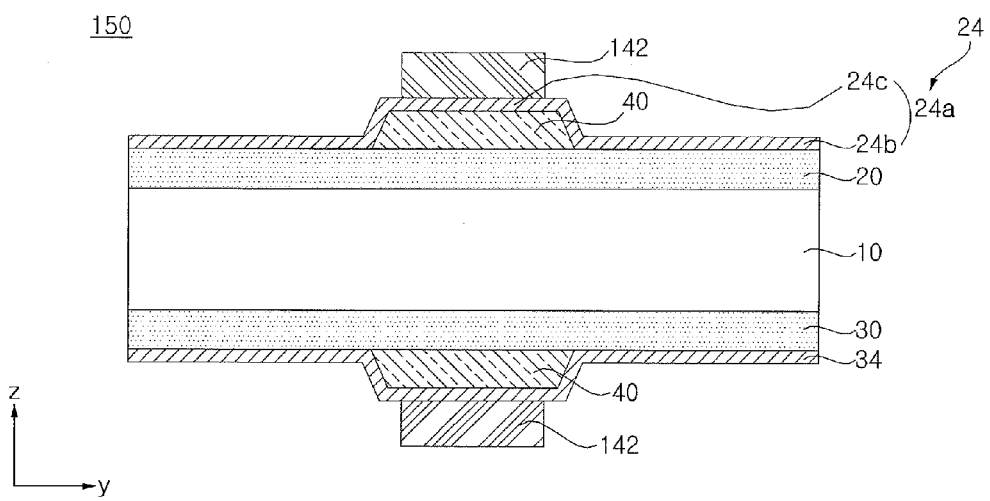
FIG. 6 is a cross-sectional view of the solar cell, taken along a line of VI-VI of FIG. 5.

Referring to FIG. 3, a solar cell 150 according to an embodiment of the invention includes a substrate (hereinafter, a semiconductor substrate) 10, dopant layers 20 and 30 formed at the semiconductor substrate 10, and electrodes 24 and 34 electrically connected to the respective dopant layers 20 and 30. More specifically, the dopant layer 20 and 30 may include an emitter layer 20 and a back surface field layer 30. Also, the electrodes 24 and 34 may include a first electrode (or a plurality of first electrodes) 24 electrically connected to the emitter layer 20, and a second electrode (or a plurality of second electrodes) 34 electrically connected to the back surface field layer 30. In addition, as shown in FIGS. 5 and 6, the solar cell 150 may further include a ribbon-connected portion 40 where the ribbon 142 is connected. The ribbon-connected portion 40 includes (or is made of) a non-conductive material. In the embodiment of the invention, the electrodes 24 and are electrically connected to the ribbon 142 on the ribbon-connected portion 40. Furthermore, the solar cell 150 may further include an anti-reflection layer 22 and a passivation layer 32. This will be described in more detail.

The semiconductor substrate 10 may include one or more of various semiconductor materials. For example, the semiconductor substrate 10 includes silicon having a dopant of a second conductivity type. Single crystal silicon or polycrystalline silicon may be used for the silicon, and the second conductivity type may be an n-type. That is, the semiconductor substrate 10 may include single crystal silicon or polycrystalline silicon having a group V element, such as phosphorus (P), arsenic (As), bismuth (Bi), antimony (Sb), or the like.

When the semiconductor substrate 10 has the n-type dopant as in the above, the emitter layer 20 of a p-type is formed at the front surface of the semiconductor substrate 10, and thereby forming a p-n junction. When light, such as sun light is incident to the p-n junction, the electrons generated by the photoelectric effect moves to the back surface of the semiconductor substrate 10 and are collected by the second electrode 34, and the holes generated by the photoelectric effect moves to the front surface of the semiconductor substrate 10 and are collected by the first electrode 24. Then, the electric energy is generated. In this instance, the holes having mobility lower than that of the electrons move to the front surface of the semiconductor substrate 10, not the back surface of the semiconductor substrate 10. Therefore, the conversion efficiency of the solar cell 150 can be enhanced.

However, the embodiments of the invention are not limited thereto. Thus, the semiconductor substrate 10 and the back surface field layer 30 may be the p-type, and the emitter layer 20 may be the n-type.

The front and back surfaces of the semiconductor substrate 10 may be a textured surface to have protruded and/or depressed portions of various shapes, such as a pyramid shape. Thus, the surface roughness is increased by the protruded and/or depressed portions, and reflectance of the incident sun light at the front surface of the semiconductor substrate 10 can be reduced by the texturing. Then, an amount of the light reaching the p-n junction between the semiconductor substrate 10 and the emitter layer 20 can increase, thereby reducing an optical loss of the solar cell 150.

The emitter layer 20 having the first conductive type dopant may be formed at the front surface of the semiconductor substrate 10. A p-type dopant such as a group III element (for example, boron (B), aluminum (Al), gallium (Ga), indium (In) or the like) may be used for the first conductive type dopant.

The anti-reflection film 22 and the first electrode 24 may be formed on the emitter 20 on the front surface of the semiconductor substrate 10 (more specifically, on the emitter layer 20 formed at the semiconductor substrate 10).

The anti-reflection film 22 may be substantially at the entire front surface of the semiconductor substrate 10, except for the portion where the first electrode 24 is formed. The anti-reflection film 22 reduces reflectance (or reflectivity) of sun light incident to the front surface of the semiconductor substrate 10. Also, the anti-reflection film 22 passivates defects at a surface or a bulk of the emitter layer 20.

By reducing the reflectance of sun light incident to the front surface of the semiconductor substrate 10, an amount of the sun light reaching the p-n junction formed between the semiconductor substrate 10 and the emitter layer 20 can be increased, thereby increasing a short circuit current (Isc) of the solar cell 150. Also, by passivating the defects at the emitter layer 20, recombination sites of minority carrier are reduced or eliminated, thereby increasing an open-circuit voltage (Voc) of the solar cell 150. Accordingly, the open-circuit voltage and the short-circuit current of the solar cell 150 can be increased by the anti-reflection film 22, and thus, the efficiency of the solar cell 150 can be enhanced.

The anti-reflection film 22 may include one or more of various materials. The anti-reflection film 22 may have a single film structure or a multi-layer film structure, and may include, for example, at least one material selected from a group consisting of silicon nitride, silicon nitride including hydrogen, silicon oxide, silicon oxy nitride, aluminum oxide, $MgF_2$, ZnS, $TiO_2$ and $CeO_2$. However, the embodiments of the invention are not limited thereto. The anti-reflection film 22 may includes one or more of various materials. Also, a front passivation film may be included between the semiconductor substrate 10 and the anti-reflection film 22.

The first electrode 24 is electrically connected to the emitter layer 20 through an opening formed at the anti-reflection film 22 or by penetrating the anti-reflection film 22. The first electrode 24 may have one of various shapes and may include one or more of various materials. This will be described later.

The back surface field layer 30 including the second conductive type dopant is formed at the back surface of the semiconductor substrate 10. The doping concentration of the back surface field layer 30 may be higher than the doping concentration of the semiconductor substrate 10 where the emitter layer 20 and the back surface field layer 30 are not formed. A n-type dopant of a group V element, such as phosphorus (P), arsenic (As), bismuth (Bi), antimony (Sb), or the like may be used for the second conductive type dopant of the back surface field layer 30.

The passivation film 32 and the second electrode 34 may be formed on the back surface of the semiconductor substrate 10.

The passivation film 32 may be substantially at the entire back surface of the semiconductor substrate 10, except for portions where the second electrode 34 is formed. The passivation film 32 passivates defects at the back surface of the semiconductor substrate 10, and eliminates the recombination sites of minority carrier. Thus, an open circuit voltage of the solar cell 150 can be increased.

The passivation film 32 may include a transparent insulating material for passing or transmitting the light. Thus, the light can be incident to the back surface of the semiconductor substrate 10 through the passivation film. 32, and thereby enhancing the efficiency of the solar cell 150. The passivation film 32 may have a single film structure or a multi-layer film structure including, for example, at least one material selected from a group consisting of silicon nitride, silicon nitride including hydrogen, silicon oxide, silicon oxy nitride, aluminum oxide, $MgF_2$, ZnS, $TiO_2$ and $CeO_2$. However, the embodiments of the invention are not limited thereto, and thus, the passivation film 32 may include one or more of various materials.

The second electrode 34 is electrically connected to the back surface field layer 30 through an opening formed at the passivation film 32 or by penetrating the passivation film 32. The second electrode 34 may have one of various shapes and may include one or more of various materials.

Also, portions of the first and second electrodes 24 and 34 on the ribbon-connected portion 40 are connected to the ribbons 142. This will be described with references to FIGS. 4 to 6. In this instance, although the first electrode 24 and the second electrode 34 have different widths, pitches, and so on, shapes of the first electrode 24 and the second electrode 34 are similar. Therefore, hereinafter, the first electrode 24 will be described only, and the descriptions of the second electrode 34 will be omitted. The following descriptions may be applied to both of the first electrode 24 and the second electrodes 34.

Figure 4:
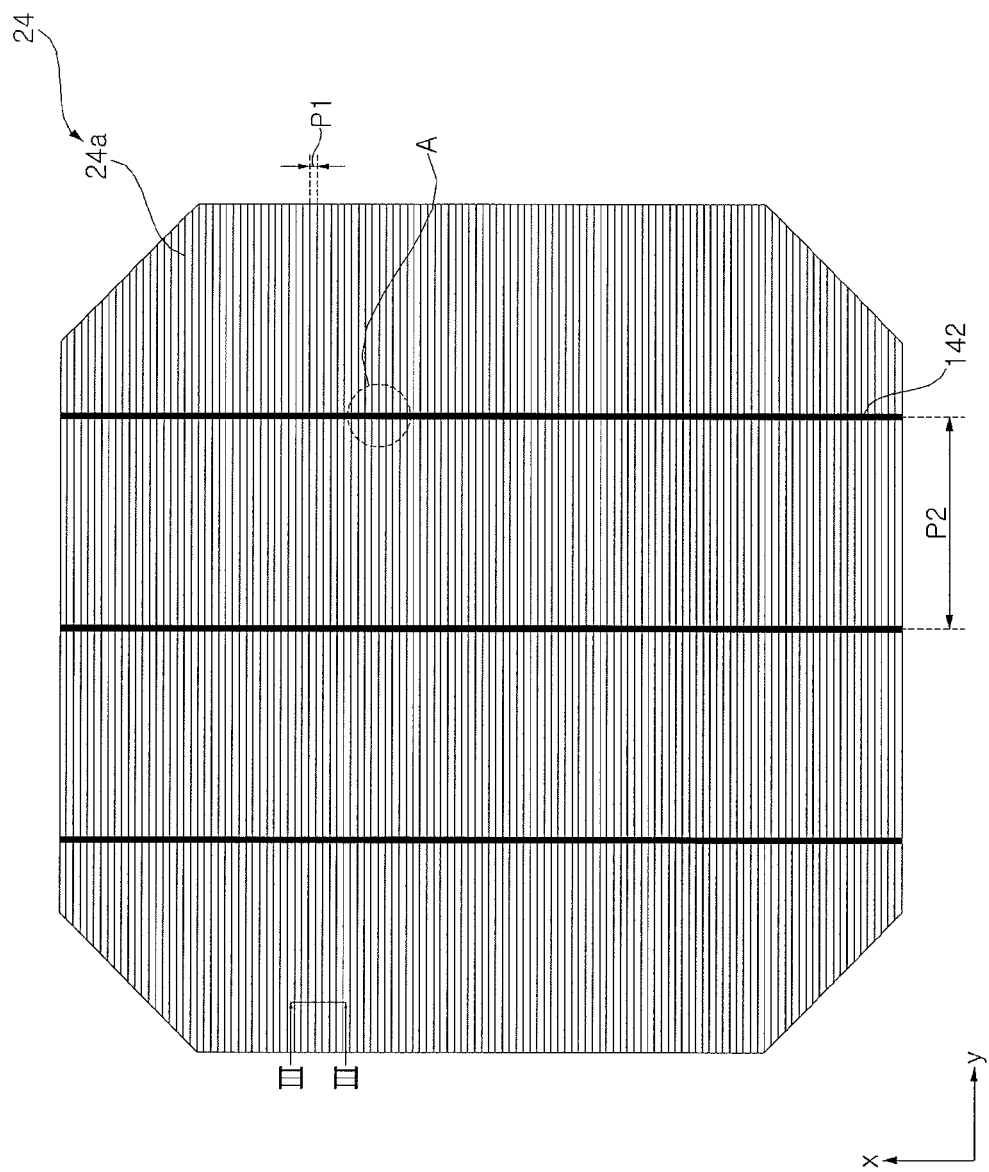
FIG. 4 is a schematic plan view of a front surface of the solar cell according to an embodiment of the invention.

FIG. 4 is a schematic plan view of a front surface of the solar cell 150 according to an embodiment of the invention. FIG. 5 is a partial exploded perspective view of a portion of A of FIG. 4, and FIG. 6 is a cross-sectional view of the solar cell, taken along a line of VI-VI of FIG. 5.

As shown in FIGS. 4 and 5, the first electrode 24 may include a plurality of finger electrodes 24a. The finger electrodes 24a are parallel to each other and are spaced apart from each other with a first pitch P1. The ribbon-connected portion 40 is formed to cross the plurality of finger electrodes 24a. The ribbon 142 is attached to the ribbon-connected portion 40. In this instance, the ribbon-connected portion 140 extends along a direction crossing the plurality of finger electrodes 24a, and the plurality of finger electrodes 24a are positioned on the ribbon-connected portion 40. The ribbon-connected portion 40 may include a single ribbon-connected portion 40, or the ribbon-connected portion 40 may include a plurality of ribbon-connected portions 40. The plurality of ribbon-connected portions 40 are spaced apart from each other with a second pitch P2 larger than the first pitch P1. The finger electrode 24a may have the width smaller than the width of the ribbon-connected portion 40. However, the embodiments of the invention are not limited thereto. Thus, the finger electrode 24a may have the width same as the width of the ribbon-connected portion 40. In the embodiment of the invention, the finger electrodes 24a are also formed on the ribbon-connected portion 40, and are electrically connected to the ribbon 142 on the ribbon-connected portion 40. This will be described in more detail with reference to FIGS. 5 and 6.

The ribbon-connected portion 40 is a portion where the ribbon 142 is settled or positioned, and where the ribbon 142 is connected through physical and/or chemical bonding. Also, the ribbon-connected portion 40 provides a space that the electrodes 24 and 34 on the ribbon-connected portion 40 can be electrically connected to the ribbon 142.

For the physical and/or chemical bonding with the ribbon 142, the ribbon-connected portion 40 may be formed by firing a paste including glass frit or a silica-based material, binder, additives, and so on. The ribbon-connected portion 40 increases adhesive power with the ribbon 142 due to the glass frit or the silica-based material. Thus, the ribbon 142 can be stably connected to the ribbon-connected portion 40. However, the embodiments of the invention are not limited thereto. Thus, one or more of various non-conductive materials having good adhesive power with the ribbon 142 may be used.

The glass frit may include at least one of PbO, ZnO, BaO, $B_2O_5$, $Bi_2O_3$ based materials. The binder may include at least one of ethyl cellulose (EC) and an acryl-based binder. However, the embodiments of the invention are not limited thereto. Thus, one or more of various materials may be used for the glass frit, the binder, or the additives.

According to the material of the ribbon-connected portion 40, the ribbon-connected portion 40 may penetrate the anti-reflection film 22 or the passivation film 32 in the case of the second electrode 34), which is an insulation film, formed on the emitter layer 20, or may be formed on the anti-reflection film 22. For example, when the glass frit included in the ribbon-connected portion 40 penetrates the anti-reflection film 22, the ribbon-connected portion 40 can penetrate the anti-reflection film 22 and be in contact with the emitter layer 20, as shown in FIG. 5. The example that the ribbon-connected portion 40 does not penetrate the anti-reflection film 22 will be described later in more detail with reference to FIG. 9.

The ribbon-connected portion 40 has a shape or portion protruded from the semiconductor substrate 10 where the emitter layer 20 is formed, and the protruded portion has predetermined thickness and width. In this instance, side surfaces of the ribbon-connected portion 40 are inclined, thereby preventing the finger electrode 24a including a first electrode portion 24b in contact with the emitter layer 20 and a second electrode portion 24c positioned on the ribbon-connected portion 40 from being cut. Accordingly, the finger electrode 24a can be stably formed. That is, if the ribbon-connected portion 40 has a sharp portion at the side surface, the finger electrode 24a may not be stably formed or may be damaged. In the embodiment of the invention, because the side surfaces of the ribbon-connected portion 40 are inclined, the problem can be prevented. However, the embodiments of the invention are not limited thereto. Therefore, the side surfaces of the ribbon-connected portion 40 may have right angles with a top surface, or cross-section of the ribbon-connected portion 40 may be round. That is, the various modifications of the embodiments of the invention are possible.

For example, the ribbon-connected portion 40 may have a thickness of about 5 µm to 30 µm and a width of about 1.8 mm or less. When the ribbon-connected portion 40 is larger than about 30 µm, the first electrode portion 24b in contact with the emitter layer 20 and the second electrode portion 24c positioned on the ribbon-connected portion 40 may not be stably formed. When the ribbon-connected portion 40 is smaller than about 5 µm, since the ribbon-connected portion 40 does not have sufficient thickness, the connection of the ribbon 142 and the ribbon-connected portion 40 may not be stable. Also, when the ribbon-connected portion 40 is larger than about 1.8 mm, the width of the ribbon 142 decreasing the light-receiving area may be large and the optical loss may increase. The lowest limit of the thickness of the ribbon-connected portion is not limited; however, for example, the lowest limit of the thickness of the ribbon-connected portion may be about 0.01 mm (more specifically, 0.07 mm).

In the embodiment of the invention, each of the plurality of finger electrodes 24a includes the first electrode portion 24b and the second electrode portion 24c. The first electrode portion 24b is in contact with the emitter layer 20 (or the back surface field layer 30 in the case of the second electrode 34) and is electrically connected to the emitter layer 20. The second electrode portion 24c is positioned on the ribbon-connected portion 40.

More specifically, in the embodiment of the invention, the first electrode portion 24b of the finger electrode 24a is a portion penetrating the anti-reflection film 22 and being in contact with the emitter layer 20. Thus, the first electrode portion 24b is electrically connected to the emitter layer 20. The second electrode portion 24c of the finger electrode 24a is a portion connected to the first electrode portion 24b and positioned on the side surfaces and the top surface of the ribbon-connected portion 40.

The ribbon 142 is attached on the ribbon-connected portion 40 and the second electrode portion 24c. The ribbon 142 may be attached to the ribbon-connected portion 40 and the second electrode portion 24c through soldering or by using the conductive film, as described above. When the ribbon 142 becomes attached by the soldering in the tabbing process, the ribbon 142 including a soldering material is in direct contact with the finger electrode 42a. When the ribbon 142 is attached by using the conductive film, the conductive film is positioned between the ribbon 142 and the finger electrode 24a. The conductive film is in contact with the ribbon 142 and the finger electrode 24a.

In the embodiment of the invention, the second electrode portions 24c of the plurality of finger electrodes 24a are formed on the ribbon-connected portion 40, and the ribbon 142 is connected thereon. The ribbon-connected portion 40 is exposed between the plurality of finger electrodes 24a formed on the ribbon-connected portion 40. Accordingly, the ribbon 142 and the plurality of finger electrodes 24a are connected to each other in a portion where the plurality of finger electrodes 24a are formed, and the ribbon-connected portion 40 and the ribbon 142 are connected to each other in portions exposed between the plurality of finger electrodes 24a.

That is, in a plan view, overlapped portions where the finger electrode 24a (and more particularly, the second electrode portion 24c) and the ribbon 142 are overlapped are formed on the ribbon-connected portion 40. At the overlapped portions, the ribbon 142 and the finger electrode 24a are connected to each other. In this instance, the embodiment of the invention includes the plurality of finger electrodes 24a, a plurality of overlapped portions are formed according to a number of the finger electrodes 24a. Likewise, in the embodiment of the invention, by connecting the plurality of finger electrodes 24a and the ribbon 142, the overlapped portions that are connection points of the plurality of finger electrodes 24a and each ribbon 142 are plural. Accordingly, it is different from the conventional structure where a connection portion is one because one busbar electrode and one ribbon are connected to each other.

Also, the portions of the ribbon-connected portion 40 exposed between the plurality of finger electrodes 24a have enhanced bonding force with the ribbon 142, and thus, act as points for connecting and fixing the ribbon 142 physically and/or chemically thereto.

In the embodiment of the invention, the ribbon-connected portion 40 has a shape of a busbar electrode; however, the ribbon-connected portion 40 includes a non-conductive material, and enhances the adhesive force with the ribbon 142 and does not relate to electrical connection. Also, the electrical connection with the ribbon 142 is achieved by the finger electrodes 24a formed on the ribbon-connected portion 40. Accordingly, the first electrode 24 and the ribbon 142 can be electrically connected well, and the adhesive force with the ribbon 142 can be enhanced by the ribbon-connected portion 40.

In addition, the ribbon-connected portion 40 does not include an expensive material, thereby reducing a manufacturing cost of the solar cell 150. More particularly, in a conventional structure, a bus bar electrode has role of being electrically connected to the ribbon and of providing adhesive force with a ribbon. Accordingly, the bus bar electrode includes an expensive or costly material such as silver (Ag), and thus, the manufacturing cost of the solar cell 150 is high. On the other hand, in the embodiment of the invention, the electrical connection is achieved by the finger electrodes 24a and the ribbon 142, and the ribbon-connected portion 40 provides the adhesive force with the ribbon 142. Therefore, the ribbon-connected portion 40 does not include an expensive material, to thereby largely reduce a manufacturing cost of the solar cell 150.

That is, according to an embodiment of the invention, the first electrode 24 and the ribbon 142 can be electrically connected as well, and the manufacturing cost of the solar cell 150 can be effectively reduced. Accordingly, the electrical property and the productivity of the solar cell 150 can be enhanced.

In the embodiment of the invention, the second electrode portion 24c is continuously extended on the ribbon-connected portion 40. Accordingly, the second electrode portion 24c is entirely formed in a width direction of the ribbon-connected portion 40, and the second electrode portion 24c is connected to the ribbon 142. Therefore, a connection area of the second electrode portion 24c and the ribbon 142 increases, thereby enhancing the electrical property of the second electrode portion 24c and the ribbon 142. Finally, an electricity flow from the second electrode portion 24c to the ribbon 142 can be smooth.

Hereinafter, a method for manufacturing a solar cell according to an embodiment of the invention will be described in more detail with reference to the accompanying drawings.

FIGS. 7a to 7g are cross-sectional views for illustrating a method for manufacturing a solar cell according to an embodiment of the invention.

Figure 7A:
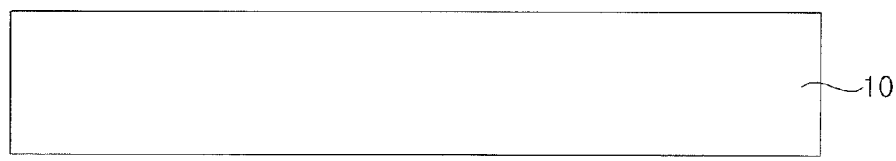
FIGS. 7a to 7g are cross-sectional views illustrating a method for manufacturing a solar cell according to an embodiment of the invention.

First, as shown in FIG. 7a, a semiconductor substrate 10 having a second conductive type dopant is prepared. The front and/or back surfaces of the semiconductor substrate 10 may be textured to have protruded and/or indented portions of various shapes (or to have an uneven surface). For the texturing method, a wet etching method or a dry etching method may be used. In the wet etching method, the semiconductor substrate 10 may be dipped into a texturing solution. According to the wet etching method, a process time can be short. In the dry etching method, the surface of the semiconductor substrate 10 is etched by a diamond drill or a laser. In the dry etching method, the protruded and/or indented portions can be uniformly formed; however, the semiconductor substrate 10 may be damaged and the process time may be long. Selectively, one of the front surface and the back surface of the semiconductor substrate 10 may be textured by a reactive ion etching method. Accordingly, the semiconductor substrate 10 may be textured by one or more of various methods.

Figure 7B:
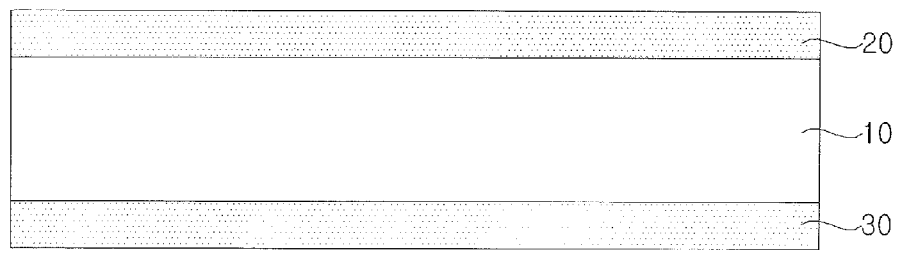

Next, as shown in FIG. 7b, the emitter layer 20 and the back surface field layer 30 as dopant layers are formed at the semiconductor substrate 10. This will be described in more detail below. The emitter layer 20 and the back surface field layer 30 may be formed by a thermal diffusion method, an ion-implantation method, or the like. However, the embodiments of the invention are not limited thereto, and thus, various modifications are possible. For example, the back surface field layer 30 may be formed by diffusion during forming of the second electrode 34.

Figure 7C:
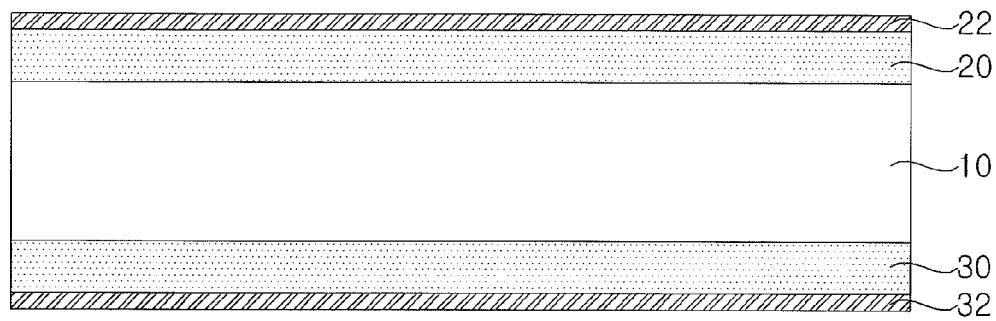

Next, as shown in FIG. 7c, an anti-reflection film 22 and a passivation film 32 are formed on the front surface and the back surface of the semiconductor substrate 10, respectively. The anti-reflection film 22 and the passivation film 32 may be formed by one or more of various methods such as a vacuum evaporation, a chemical vapor deposition, a spin coating, a screen printing, or a spray coating.

Figure 7D:
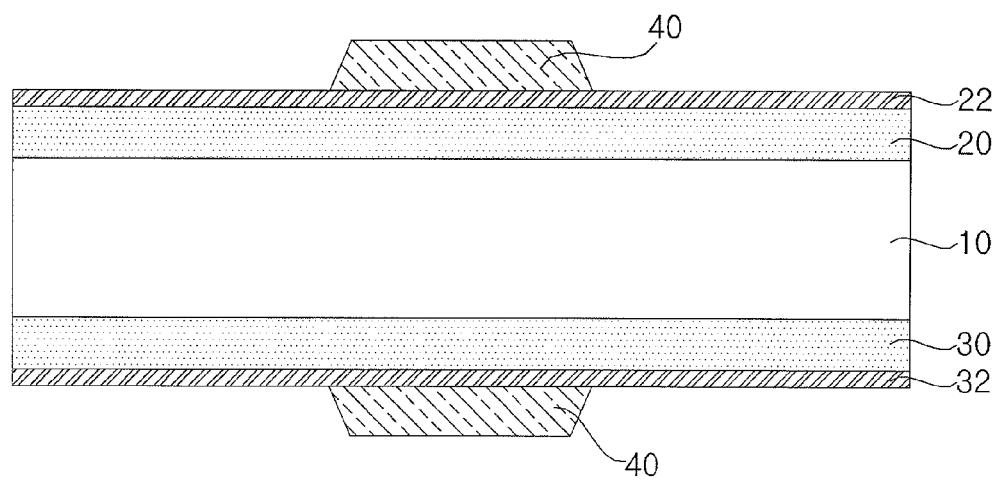

Next, as shown in FIG. 7d, ribbon-connected portions 40 are formed on the front surface and the back surface of the semiconductor substrate 10, respectively. The ribbon-connected portions 40 are formed to correspond to portions where ribbons (142 of FIG. 7g) are connected. The ribbon-connected portion 40 may be formed by drying and/or firing a paste including glass frit or a silica-based material, binder, additives, and so on. One or more method may be used for the coating method and the drying and/or firing method.

Figure 7E:
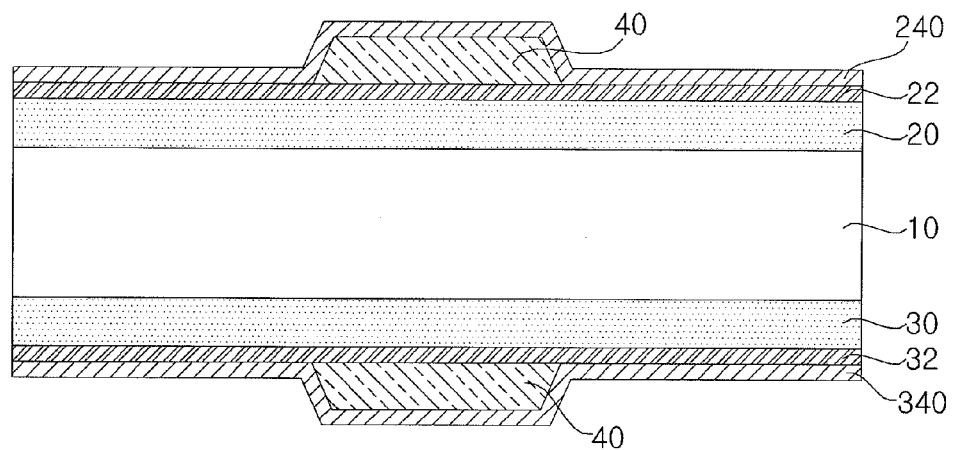

Next, as shown in FIG. 7e, pastes 240 and 340 for first and second electrodes are formed on the anti-reflection film 22 and the passivation film 32 that are insulation films, respectively. The pastes 240 and 340 for first and second electrodes may be coated by a printing method, or the like. However, the embodiments of the invention are not limited thereto, and the pastes 240 and 340 for first and second electrodes can be coated by different methods.

Figure 7F:
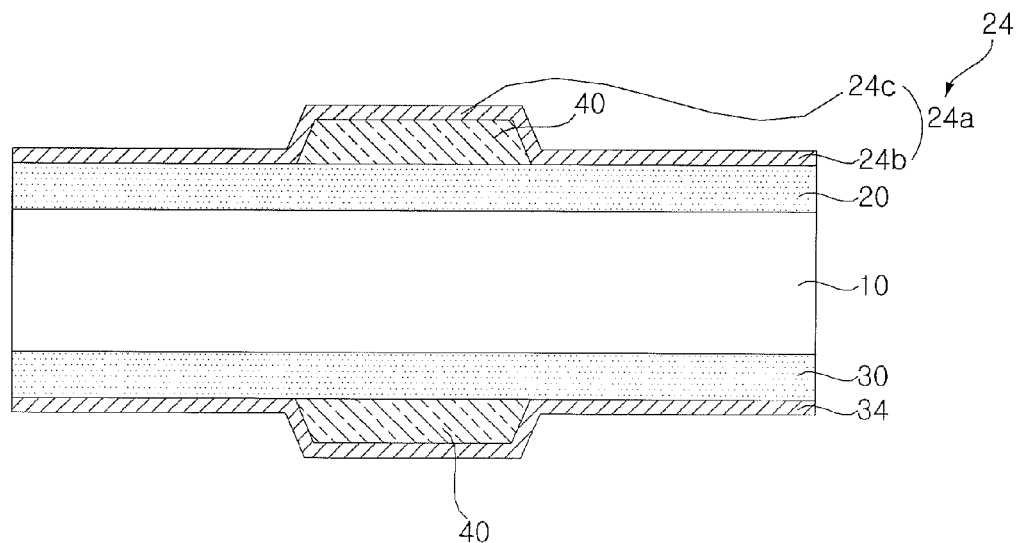

Next, as shown in FIG. 7f, first and second electrodes 24 and 34 are formed by performing a heat-treatment of firing. The fire-through phenomenon is induced by the firing. Thus, the first electrode portions 24b of the first electrode 24 are in contact with the emitter layer 20 by penetrating the anti-reflection film 22. Similarly, the second electrode 34 at a portion where the ribbon-connected portion 40 is not formed is in contact with the back surface field layer 30 by penetrating the passivation film 32. In the embodiment of the invention, fire through is induced by the ribbon-connected portion 40, and the anti-reflection film 22 or the passivation film 32 under the ribbon-connected portion 40 is eliminated.

Figure 7G:
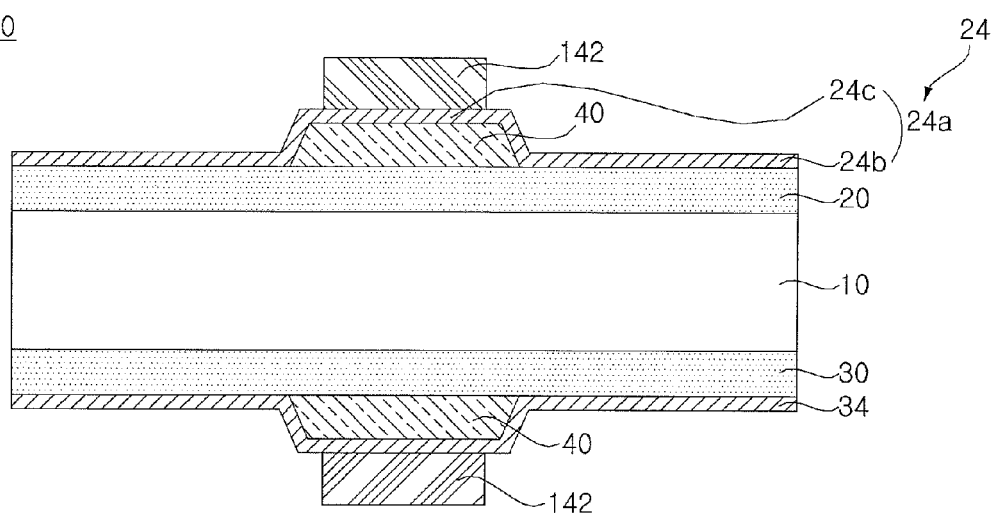

Next, as shown in FIG. 7g, the ribbon 142 is attached on the ribbon-connected portion 40 and the second electrode portion 24c. One or more of various methods may be used for an attaching method.

In the drawings, the ribbon-connected portion 40 and electrodes 24 and 34 are depicted as being in direct contact with the ribbon 142; however, the embodiments of the invention are not limited thereto. Therefore, an additional adhesive (for example, the conductive film) may be formed on the ribbon-connected portion 40 and the electrodes 24 and 34, and the ribbon 142 may be formed on the additional adhesive.

In the drawing and the above descriptions, after the pastes 240 and 340 for first and second electrodes are formed on the anti-reflection film 22 and the passivation film 32, first and second electrodes 24 and 34 are brought into contact with the emitter layer 20 and the back surface field layer 30 by the fire-through, respectively. However, the embodiments of the invention are not limited thereto. Therefore, openings may be formed first at the anti-reflection film 22, and the first electrode 24 may be formed inside the openings through use of a plating method, an evaporation method, or the like. Also, after forming the openings at the passivation film 32, the second electrode 34 may be formed inside the openings through use of a plating method, an evaporation method, or the like. The first and second electrodes 24 and 34 may be in contact with the emitter layer 20 and the back surface field layer 30, respectively, by other various methods.

In the embodiment of the invention, after forming dopant layers (the emitter layer 20 and the back surface field layer 30), the anti-reflection film 22 and the passivation film 32 are formed. Then, the first and second electrodes 24 and 34 are formed. However, the embodiments of the invention are not limited thereto. Therefore, a manufacturing sequence of the emitter layer 20, the back surface field layer 30, the anti-reflection film 22, the passivation film 32, the first electrode 24, and the second electrode 34 may be variously modified.

Hereinafter, a solar cell according to other embodiments of the invention will be described in more detail with reference to FIGS. 8 to 18. In the following descriptions, portions that were already described above will not be repeated, and portions that are not described in the above will be described in detail.

Figure 8:
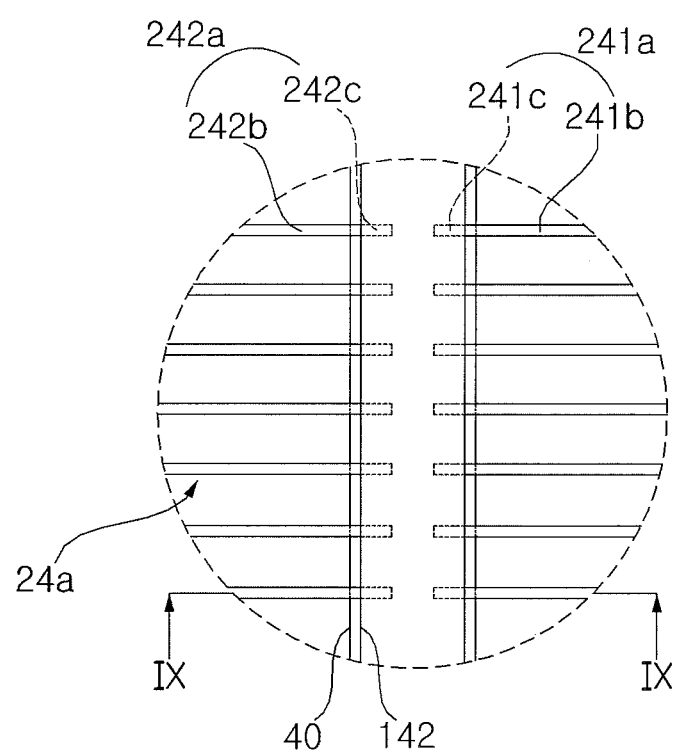
FIG. 8 is a plan view of a solar cell according to another embodiment of the invention.
Figure 9:
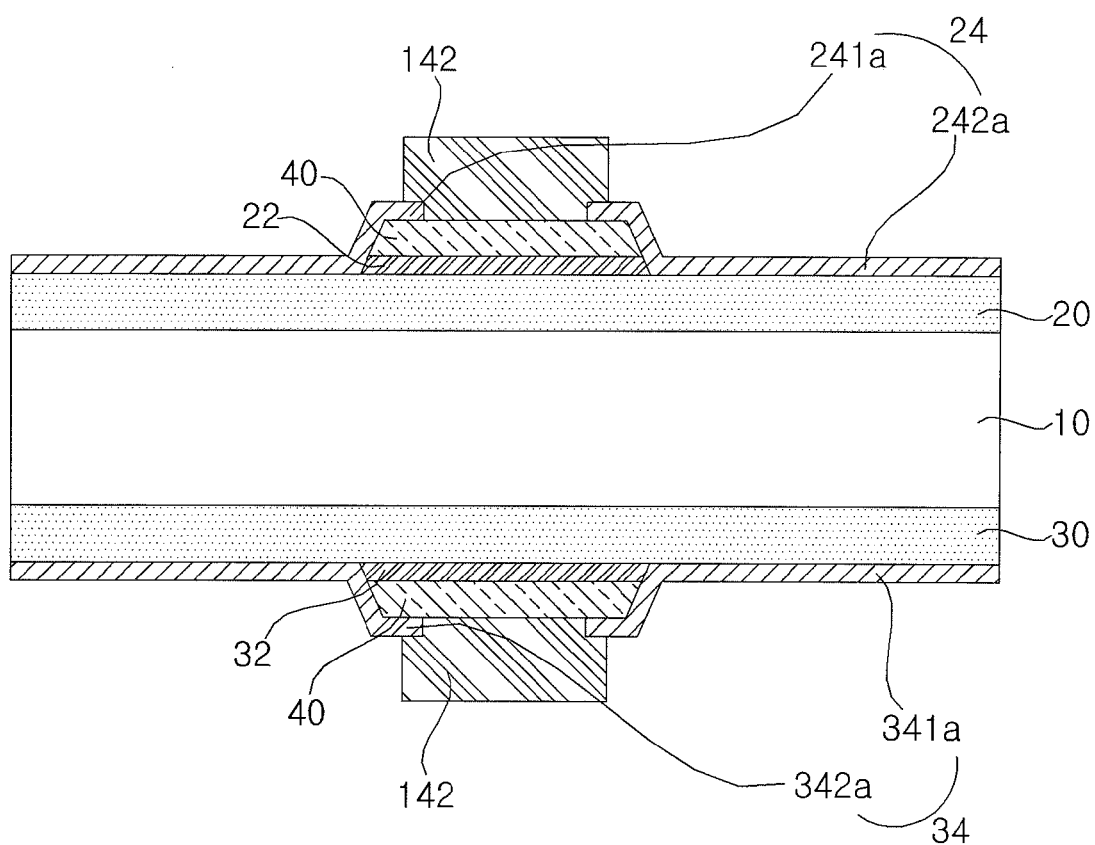
FIG. 9 is a cross-sectional view of the solar cell, taken along a line of IX-IX of FIG. 8.

FIG. 8 is a plan view of a solar cell according to another embodiment of the invention, and FIG. 9 is a cross-sectional view of the solar cell, taken along a line of IX-IX of FIG. 8.

In the embodiment of the invention, finger electrodes 241a and 242a includes first electrode portions 241b and 242b being in contact with a dopant layer (that is, an emitter layer 20 or a back surface field layer 30) and second electrode portions 241c and 242c positioned on the ribbon-connected portion 40. In this instance, as shown in FIG. 8, one finger electrode 241a formed at one side of the ribbon-connected portion 40 and the other finger electrode 242a formed at the other side of the ribbon-connected portion 40 are spaced apart from each other on the ribbon-connected portion 40. More particularly, the second electrode portion 241c of the one finger electrode 241a formed at one side of the ribbon-connected portion 40 and the second electrode portion 242c of the other finger electrode 242a formed at the other side of the ribbon-connected portion 40 are spaced apart from each other on the ribbon-connected portion 40. Accordingly, an amount of a raw material for forming the finger electrodes 241a and 242a can be reduced, thereby further reducing the material cost.

In this instance, in the embodiment of the invention as shown in FIG. 9, the ribbon-connected portion 40 may be formed on the anti-reflection film 22 or the passivation film 32. The ribbon-connected portion 40 of this structure may be formed by various methods. For example, a paste of the ribbon-connected portion 40 may not include a material for inducing the fire-through (for example, glass frit), or a heat-treatment for drying and/or firing the coated paste may be performed at a temperature that does not induce the fire-through.

As shown in FIG. 9, when the ribbon-connected portion 40 is formed on the anti-reflection film 22 or the passivation film 32, reactions between a material included in the ribbon-connected portion 40 and the anti-reflection film 22 (or the passivation film 32) can be reduced or prevented. Accordingly, degradation of the anti-reflection film 22 or the passivation film 32 can be reduced or prevented. Accordingly, properties of the solar cell 150 and efficiency of the solar cell 150 can be enhanced. However, the embodiments of the invention are not limited thereto. Therefore, the ribbon-connected portion 40 may be in contact with the emitter layer 20 or the back surface field layer 30.

In the above embodiment of the invention, the first electrode portion and the second electrode portion have the same of similar widths. However, the embodiments of the invention are not limited thereto. Therefore, the first electrode portion and the second electrode portion may have different widths from each other. This will be described in more detail with reference to FIGS. 10 and 11.

Figure 10:
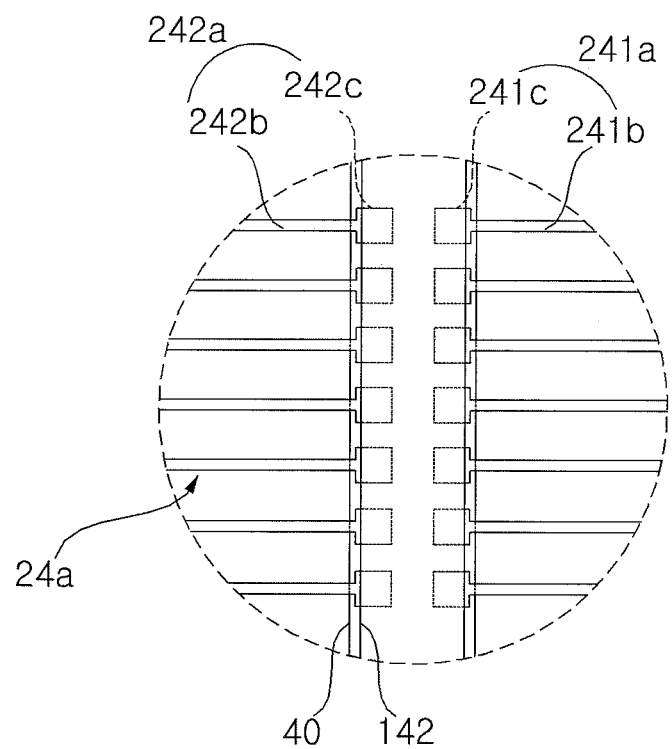
FIG. 10 is a plan view of a solar cell according to yet another embodiment of the invention.
Figure 11:
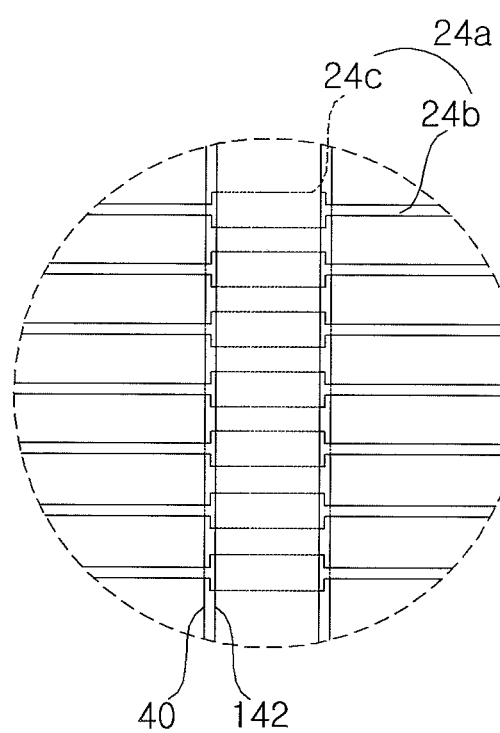
FIG. 11 is a plan view of a solar cell according to still another embodiment of the invention.

FIG. 10 is a plan view of a solar cell according to yet another embodiment of the invention, and FIG. 11 is a plan view of a solar cell according to still another embodiment of the invention.

Referring to FIG. 10, a second electrode portion 241c of one finger electrode 241a formed at one side of a ribbon-connected portion 40 and a second electrode portion 242c of the other finger electrode 242a formed at the other side of the ribbon-connected portion 40 are spaced apart from each other on the ribbon-connected portion 40. In this instance, the second electrode portions 241c and 242c have widths larger than first electrode portions 241b and 242b, respectively. Accordingly, the first electrode portions 241b and 242b that are not connected to the ribbon 142 have relatively small widths, and thus, a light-receiving area can be maximized. The second electrode portions 241c and 242c that are connected to the ribbon 142 have relatively large widths, and thus, a connection area with the ribbon 142 can be increased and electrical property can be enhanced. Accordingly, property or characteristic of a solar cell 150 can be enhanced and efficiency of the solar cell 150 can be maximized.

In FIG. 10, the second electrode portions 241c and 242c have quadrangle shapes. However, the embodiments of the invention are not limited thereto. Therefore, the second electrode portions 241c and 242c have various plan shapes such as a circle, an ellipse, or a polygon besides the quadrangle.

Referring to FIG. 11, a second electrode portion 24c is continuously formed on the ribbon-connected portion 40 and has a width larger than a width of a first electrode portion 24b. Then, a connection area for contact with a ribbon 142 can be further increased and electrical property can be further enhanced.

In FIG. 11, the second electrode portion 24c has a quadrangle shape. However, the embodiments of the invention are not limited thereto. Therefore, the second electrode portion 24c has various plan shapes such as a circle, an ellipse, or a polygon besides the quadrangle.

Also, in the above embodiment of the invention, each of the dopant layers (the emitter layer 20 and the back surface field layer 30) has a uniform doping concentration. However, the embodiments of the invention are not limited thereto. A modified embodiment of the invention will be described in detail with reference to FIG. 12.

Figure 12:
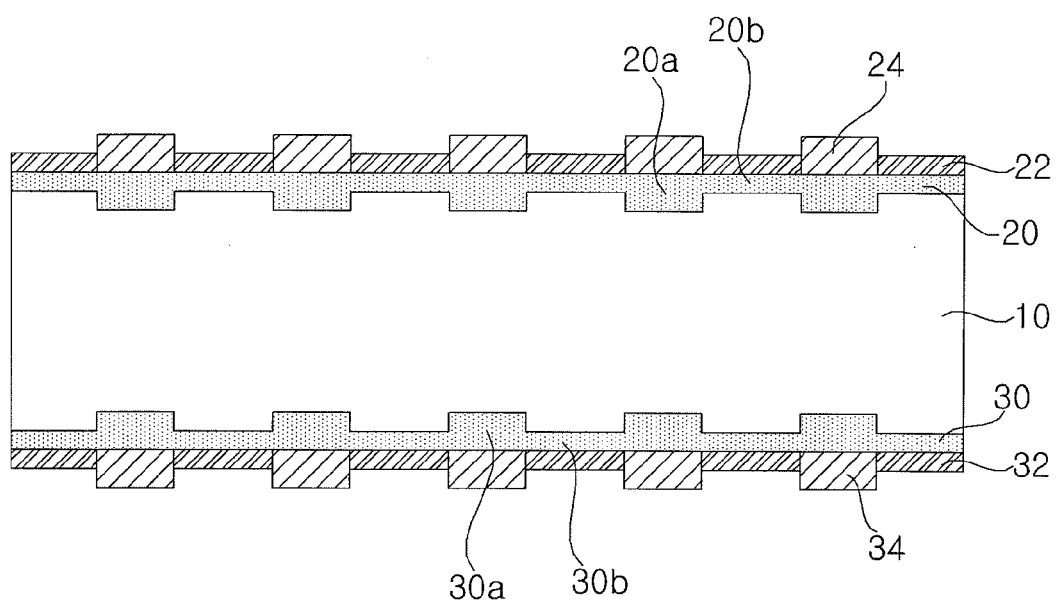
FIG. 12 is a cross-sectional view of a solar cell according to still another embodiment of the invention.

FIG. 12 is a cross-sectional view of a solar cell according to still another embodiment of the invention.

Referring to FIG. 12, in the embodiment of the invention, an emitter layer 20 may include a first portion 20a formed adjacent to and in contact with a part or a whole portion (that is, at least a part) of the first electrode 24, and a second portion 20b other than the first portion 20a. Such a structure is referred to as a selective emitter structure. The first portion 20a has a doping concentration higher than that of the second portion 20b, and thus, the first portion 20a has a resistance lower than that of the second portion 20b.

Then, the shallow emitter can be achieved by forming the second portion 20b with a relatively low resistance at a portion corresponding to a portion between the first electrode 24 where the sun light is incident. Accordingly, current density of the solar cell 150 can be enhanced. In addition, contact resistance with the first electrode 24 can be reduced by forming the first portion 20a with a relatively low resistance at a portion adjacent to the first electrode 24. That is, since the emitter layer 20 has the selective emitter structure, the efficiency of the solar cell 150 can be maximized.

In the embodiment of the invention, the emitter layer 20 is formed at the front surface of the semiconductor substrate 10. However, the embodiments of the invention are not limited thereto. That is, the emitter layer 20 may extend to the back surface of the semiconductor substrate 10. In this case, the solar cell 150 is a back contact solar cell.

In the embodiment of the invention, the back surface field layer 30 may include a first portion 30a formed adjacent to and in contact with a part or a whole portion (that is, at least a part) of the second electrodes 34, and a second portion 30b other than the first portion 30a. The first portion 30a has a doping concentration of the second dopant 302 higher than that at the second portion 30b, and thus, the first portion 30a has a resistance lower than that of the second portion 30b.

Then, the recombination of the electrons and the holes can be reduced or prevented by forming the second portion 30b with a relatively high resistance at a portion corresponding to a portion between the second electrode 34, and thereby enhancing the current density of the solar cell. In addition, contact resistance with the second electrode 34 can be reduced by forming the first portion 30a with a relatively low resistance at a portion adjacent to the second electrode 34. That is, when the back surface field layer 30 has the selective back surface field structure, the efficiency of the solar cell 150 can be maximized.

However, the embodiments of the invention are not limited thereto. The back surface field layer 30 may have a local back surface field structure. In the local back surface field structure, the back surface field layer 30 is locally formed at a portion of the back surface of the semiconductor substrate 10 that the second electrode 34 is in contact with. That is, the back surface field layer 30 may only include the first portion 30a corresponding to the at least the part of the second electrode 34.

In the embodiment of the invention, both of the emitter layer 20 and the back surface field layer 30 have selective structures. However, the embodiments of the invention are not limited thereto. Only one of the emitter layer 20 and the back surface field layer 30 may have a selective structure in other embodiments of the invention.

Hereinafter, a second electrode portion according to various embodiments of the invention will be described in detail with reference to FIGS. 13 to 18. For clarity of illustration, in FIGS. 13 to 18, a ribbon-connected portion and electrode are only shown without a ribbon. In the following description, portions that were already described above will not be repeated, and the portions that are not described in the above will be described in detail. Also, although a reference numeral of finger electrodes 24a is used, the following structure may be applied to a second electrode 34.

Figure 13:
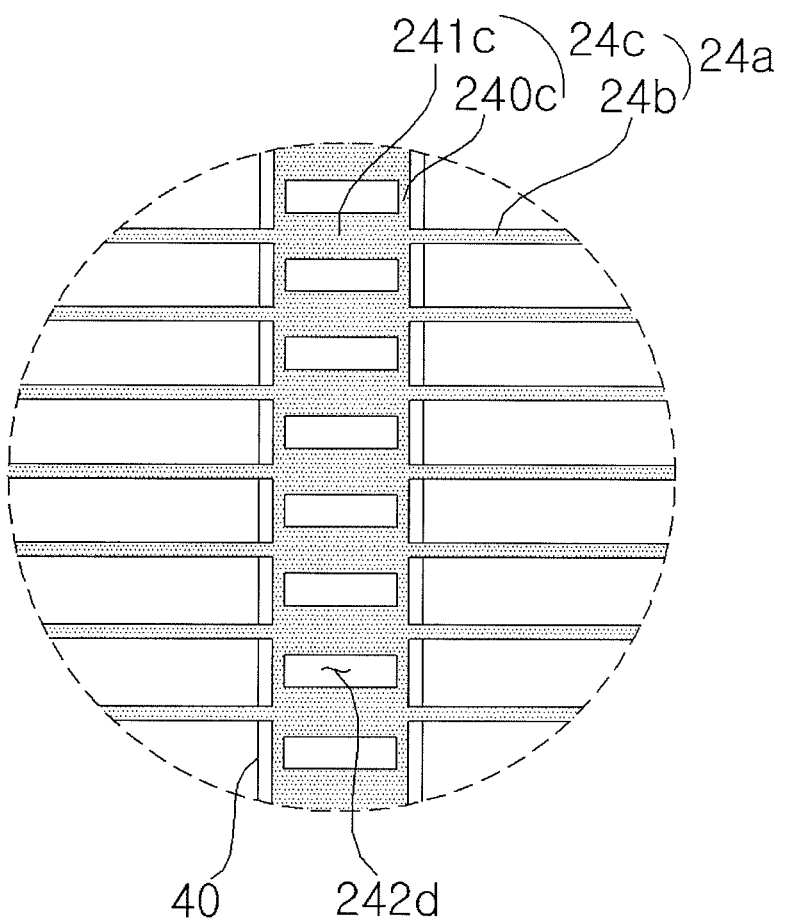
FIG. 13 is a plan view of a ribbon-connected portion and an electrode of a solar cell according to still another embodiment of the invention.

FIG. 13 is a plan view of a ribbon-connected portion and an electrode of a solar cell according to still another embodiment of the invention.

Referring to FIG. 13, the second electrode portions 24c of the plurality of finger electrodes 24a according to an embodiment of the invention includes a portion 241c parallel to the first electrode portion 24b and a portion 240c crossing the first electrode portion 24b. That is, two portions 240c crossing the first electrode portion 24b are formed to correspond to both sides of the ribbon-connected portion 40. Between the two portions 240c, portions parallel to a plurality of first electrode portion 24b may be positioned. Then, a plurality of openings 242d may be formed inside the second electrode portion 24c. Thus, the second electrode portion 24c may have a ladder shape.

Accordingly, an area of the second electrode portion 24c electrically connected to a ribbon (142 in FIG. 5) can be increased, and a used amount of a raw material for forming the second electrode portion 24c can be reduced by the openings 242d. Also, the ribbon 142 can be physically and/or chemically bonded to the ribbon-connected portion 40 through portions exposed between the openings 242d.

Accordingly, according to an embodiment of the invention, connection property of the ribbon-connected portion 40 and the ribbon 142 can be improved, a manufacturing cost of the finger electrode 24a can be reduced, and electrical property of the first electrode 24 and the ribbon 142 can be enhanced. Also, due to the portions 240c crossing the first electrode portion 24b, stress concentration generated when the electrode is formed in one direction can be relaxed.

Figure 14:
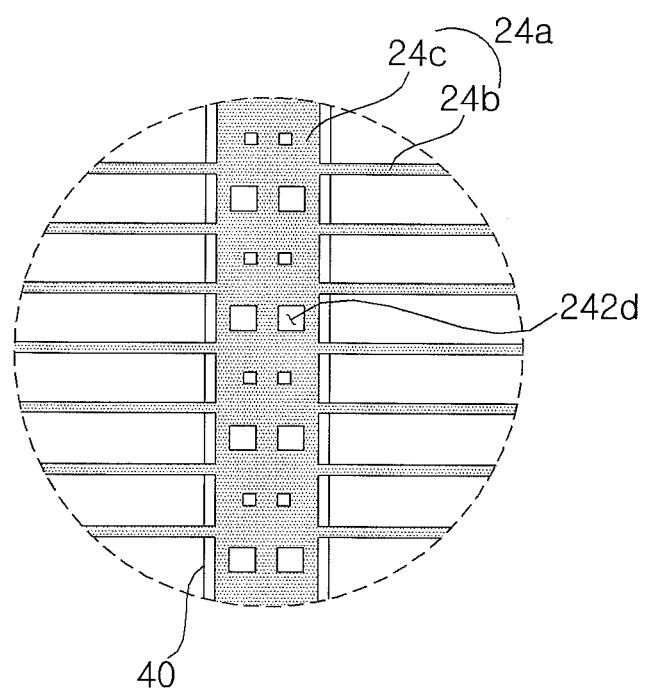
FIG. 14 is a plan view of a ribbon-connected portion and an electrode of a solar cell according to still another embodiment of the invention.

In the embodiment of the invention shown in FIG. 13, the openings 242d have uniform sizes and are regularly arranged. However, the embodiments of the invention are not limited thereto. Therefore, as shown in FIG. 14, the sizes of the openings 242d may be varied, and a plurality of openings 242d are positioned in a direction parallel to the first electrode portion 24b. Also, the openings 242d may be arranged irregularly and randomly. This may be induced by process errors or by needs or desire of electrode design. Accordingly, the degree of freedom in design can be increased.

Figure 15:
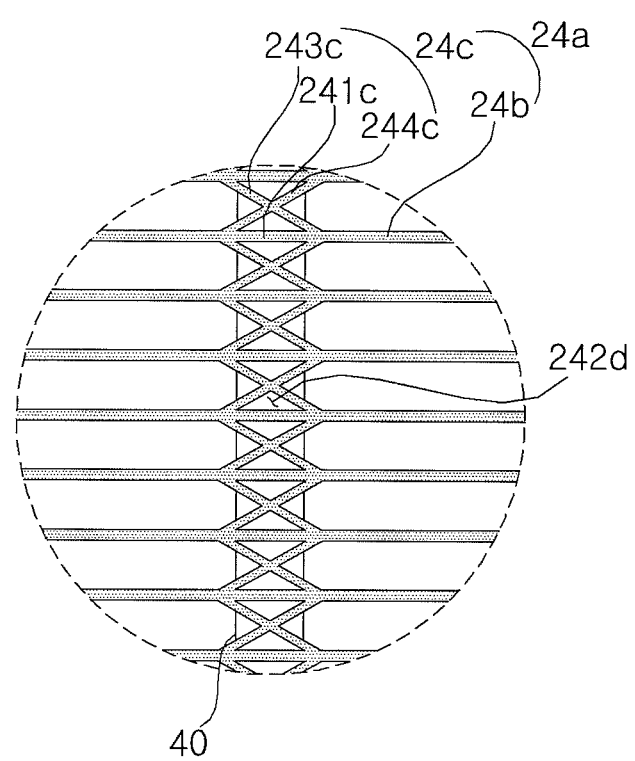
FIG. 15 is a plan view of a ribbon-connected portion and an electrode of a solar cell according to still another embodiment of the invention.
Figure 16:
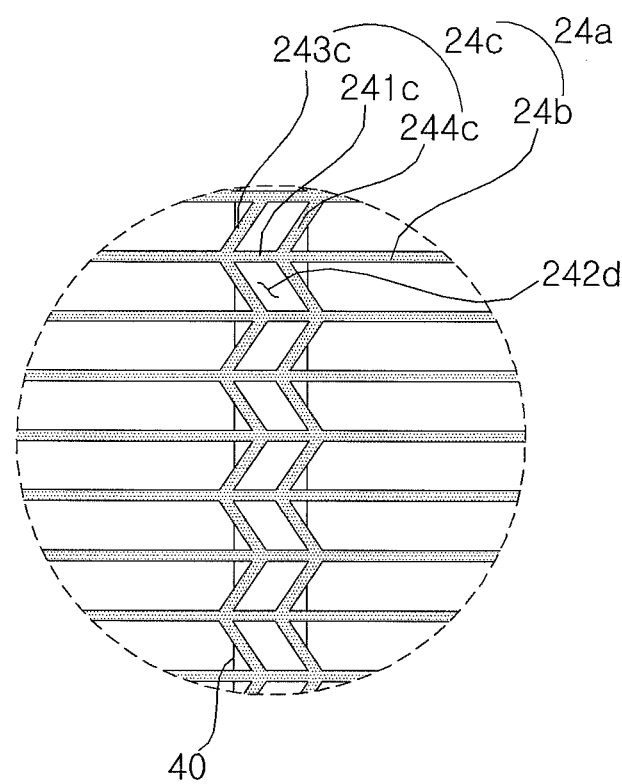
FIG. 16 is a plan view of a ribbon-connected portion and an electrode of a solar cell according to still another embodiment of the invention.

FIG. 15 is a plan view of a ribbon-connected portion and an electrode of a solar cell according to still another embodiment of the invention.

Referring to FIG. 15, the second electrode portions 24c of the plurality of finger electrodes 24a according to an embodiment of the invention includes a portion 241c parallel to the first electrode portion 24b and portions 243c and 244c inclined to the first electrode portion 24b. In this instance, two portions 243c and 244c are inclined to the first electrode portion 24b and cross each other, and the openings 242d have a triangle shape.

In the embodiment of the invention, portions 243c and 244c inclined to the first electrode portion 24b may be formed beyond the ribbon-connected portion 40. Then, if a part of the ribbon 142 is positioned beyond the ribbon-connected portion 40 by a small process error, the ribbon 142 can be electrically connected to the first electrode portion 24b and the portions 243c and 244c.

Accordingly, electrical stability with the ribbon 142 can be enhanced. In addition, the electrical property of the ribbon-connected portion 40 and the ribbon 142 can be improved, a manufacturing cost of the finger electrode 24a can be reduced, and electrical property of the first electrode 24 and the ribbon 142 can be enhanced. Also, due to the first electrode portion 24b and the portions 243c and 244c, stress concentration generated when the electrode is formed in one direction can be relaxed.

In FIG. 15, the portions 243c and 244c are inclined to the first electrode portion 24b and cross each other. However, the embodiments of the invention are not limited thereto. The portions 243c and 244c inclined to the first electrode portion 24b may be parallel to each other. In this instance, when the inclined directions of the portions 243c and 244c are alternatively changed, the portions 243c and 244c may have zigzag shapes. In this case, the openings 242d may have parallelogram shapes.

In this instance, a number of portions inclined to the first electrode portion 24b may be one, or three or more. Also, the portions inclined to the first electrode portion 24b may cross each other at some regions as shown in FIG. 14, and the portions inclined to the first electrode portion 24b may be parallel to each other at other regions. In addition, the portions 241c parallel to the first electrode portion 24b may be not formed. That is, shapes of the second electrode portion 24c may be varied.

Figure 17:
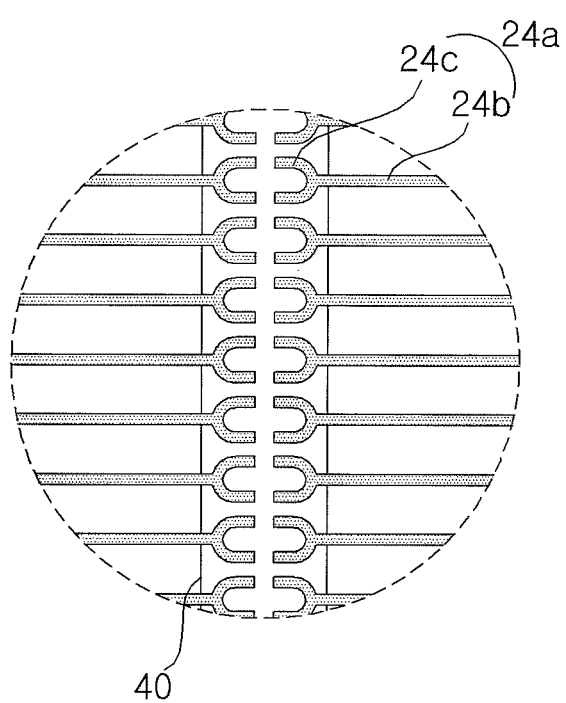
FIG. 17 is a plan view of a ribbon-connected portion and an electrode of a solar cell according to still another embodiment of the invention.

FIG. 17 is a plan view of a ribbon-connected portion and an electrode of a solar cell according to still another embodiment of the invention.

Referring to FIG. 17, the second electrode portion 24c may be branched to a plurality of portions (for example, two portions in FIG. 17) at a portion adjacent to the ribbon-connected portion 40. Accordingly, because a number of the second electrode portion 24c having a small width increases, the second electrode portion 24c has a relatively large area on the ribbon-connected portion 40. Accordingly, according to an embodiment of the invention, a connection area with the ribbon 142 can be increased, and a manufacturing cost of the finger electrode 24a can be reduced by minimizing an amount of raw material used.

Figure 18:
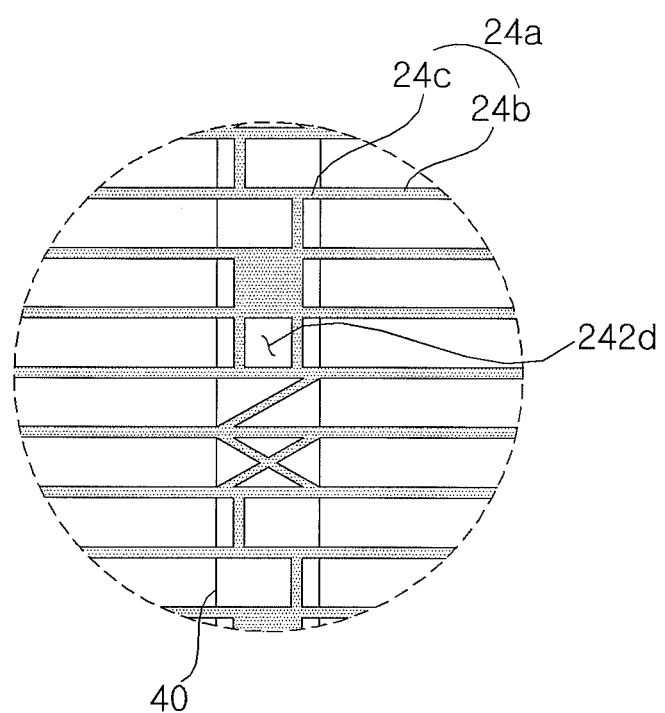
FIG. 18 is a plan view of a ribbon-connected portion and an electrode of a solar cell according to still another embodiment of the invention.

FIG. 18 is a plan view of a ribbon-connected portion and an electrode of a solar cell according to still another embodiment of the invention.

Referring to FIG. 18, the second electrode portion 24c according to an embodiment of the invention includes a portion parallel to the first electrode portion 24b, a portion perpendicular to the first electrode portion 24b, a portion inclined to the second electrode portion 24c, and/or an opening 242d where the second electrode portion 24c is eliminated. Accordingly, stress applied to the second electrode portion 24c can be randomly distributed, and the electrical property with the ribbon 142 can be enhanced.

In the embodiment of the invention, a ribbon-connected portion includes a non-conductive material, and enhances the adhesive force with the ribbon and does not relate to electrical connection. Also, the electrical connection with a ribbon is achieved by finger electrodes formed on the ribbon-connected portion. Accordingly, an electrode and the ribbon can be electrically connected well, and the adhesive force between the ribbon and the ribbon-connected portion can be enhanced by the ribbon-connected portion. Therefore, the ribbon-connected portion does not include an expensive material, thereby reducing a manufacturing cost of the solar cell.

That is, according to an embodiment of the invention, the electrode and the ribbon can be electrically connected well, and the manufacturing cost of the solar cell can be effectively reduced. Accordingly, the electrical property and the productivity can be enhanced.

Certain embodiments of the invention have been described. However, the embodiments of the invention are not limited to the specific embodiments described above; and various modifications of the embodiments are possible by those skilled in the art to which the invention belongs without leaving the scope defined by the appended claims.

What is claimed is:

1. A solar cell module, comprising:
   a semiconductor substrate;
   a dopant layer formed at the semiconductor substrate;
   an electrode electrically connected to the dopant layer, wherein the electrode comprises a plurality of finger electrodes that are parallel to each other, and wherein the plurality of finger electrodes extend in a first direction,
   an insulation film formed on the dopant layer, wherein at least a part of the plurality of finger electrodes penetrate the insulation film,
   a ribbon-connected portion formed between the dopant layer and the plurality of finger electrodes, wherein the ribbon-connected portion extends in a second direction crossing the first direction,
   wherein the ribbon-connected portion is non-conductive and comprises a glass fit, and
   wherein each of the plurality of finger electrodes comprises a first electrode portion being in contact with the dopant layer and a second electrode portion being formed on the ribbon-connected portion; and
   a ribbon on and directly contacted to the ribbon-connected portion and the second electrode portion that is extending in the first direction and is positioned on the ribbon-connected portion.

2. The solar cell module according to claim 1, wherein a part of the ribbon-connected portion disposed between the plurality of finger electrodes is connected to the ribbon.

3. The solar cell module according to claim 1, wherein the second electrode portion is formed on an upper surface and a side surface of the ribbon-connected portion, and
   the second electrode portion extends continuously on the ribbon-connected portion.

4. The solar cell module according to claim 1, wherein the second electrode portion is formed on an upper surface and a side surface of the ribbon-connected portion, and
   the second electrode portion has a width larger than a width of the first electrode portion.

5. The solar cell module according to claim 1, wherein the second electrode portion is formed on an upper surface and a side surface of the ribbon-connected portion, and
   the second electrode portion comprises at least one of a portion parallel to the first electrode portion, a portion inclined to the first electrode portion, a portion crossing the first electrode portion, a plurality of portions branched from the first electrode portion, and an opening formed at a part of the second electrode portion.

6. The solar cell module according to claim 1, wherein the part of the plurality of finger electrodes that penetrates the insulation film is in contact with the dopant layer, and
the ribbon-connected portion is formed on the insulation film.

7. The solar cell module according to claim 1, wherein the ribbon-connected portion penetrates the insulation film and is in contact with the dopant layer.

8. The solar cell module according to claim 1, wherein the ribbon-connected portion has an inclined side surface.

9. The solar cell module according to claim 1, wherein the ribbon-connected portion has a thickness of about 5 μm to 30 μm.

10. The solar cell module according to claim 1, wherein the ribbon-connected portion has a width of about 1.8 mm or less.

11. The solar cell module according to claim 1, wherein the ribbon-connected portion further comprises a silica-based material.

12. The solar cell module according to claim 1, wherein a portion of the plurality of finger electrodes is partially formed on the ribbon-connected portion.

13. The solar cell module according to claim 1, wherein the second electrode portion comprises a first portion formed on one side of the ribbon-connected portion and a second portion formed on the other side of the ribbon-connected portion, and the second portion is spaced apart from the first portion.

14. The solar cell module according to claim 1, wherein a width of a bottom surface of the ribbon in contact with the ribbon-connected portion is smaller than a width of a front surface of the ribbon that faces the bottom surface.

15. A solar cell module, comprising:
a semiconductor substrate;
a dopant layer formed at the semiconductor substrate;
an electrode electrically connected to the dopant layer, wherein the electrode comprises a plurality of finger electrodes that are parallel to each other, and wherein the plurality of finger electrodes extend in a first direction;
a ribbon electrically connected to the electrode, wherein the ribbon extends in a second direction crossing the first direction to an outside of the semiconductor substrate;
an anti-reflection layer formed on the dopant layer; and
a ribbon-connected portion formed between the plurality of finger electrodes and the dopant layer at portions where the plurality of finger electrodes and the ribbon are overlapped with each other, wherein the ribbon-connected portion is non-conductive and comprises a glass frit,
wherein at least a part of the plurality of finger electrodes penetrate the anti-reflection layer to be connected to the dopant layer,
wherein the plurality of finger electrodes are connected to the ribbon on the ribbon-connected portion,
wherein the ribbon is disposed on the ribbon-connected portion and the plurality of finger electrodes,
wherein each of the plurality of finger electrodes comprises a first electrode portion being in contact with the dopant layer and a second electrode portion being formed on the ribbon-connected portion, and
wherein the ribbon is directly contacted to the ribbon connected portion and the second electrode portion that is extending in the first direction and is positioned on the ribbon-connected portion.

16. The solar cell module according to claim 15, wherein the ribbon-connected portion has an inclined side surface.

17. The solar cell module according to claim 15, wherein the ribbon-connected portion extends along a direction crossing the plurality of finger electrodes,
a part of the ribbon-connected portion is exposed between the plurality of finger electrodes, and
the ribbon is electrically connected to the plurality of finger electrodes at a portion where the plurality of finger electrodes are formed and is connected to the ribbon-connected portion at the exposed part of between the plurality of finger electrodes.

18. The solar cell module according to claim 15, wherein the plurality of the finger electrodes and the ribbon are in direct contact with each other.

19. The solar cell module according to claim 15, wherein the plurality of finger electrodes and the ribbon are partially overlapped with each other.

20. The solar cell module according to claim 15, wherein the second electrode portion comprises a first portion formed on one side of the ribbon-connected portion and a second portion formed on the other side of the ribbon-connected portion, and the second portion is spaced apart from the first portion.

21. The solar cell module according to claim 15, wherein a width of a bottom surface of the ribbon in contact with the ribbon-connected portion is smaller than a width of a front surface of the ribbon that faces the bottom surface.

* * * * *